(12) United States Patent
Beaman et al.

(10) Patent No.: US 7,282,945 B1
(45) Date of Patent: Oct. 16, 2007

(54) WAFER SCALE HIGH DENSITY PROBE ASSEMBLY, APPARATUS FOR USE THEREOF AND METHODS OF FABRICATION THEREOF

(75) Inventors: Brian Samuel Beaman, Apex, NC (US); Keith Edward Fogel, Mohegan Lake, NY (US); Paul Alfred Lauro, Nanuet, NY (US); Da-Yuan Shih, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/254,769

(22) PCT Filed: Sep. 12, 1997

(86) PCT No.: PCT/US97/16264

§ 371 (c)(1),
(2), (4) Date: Mar. 11, 1999

(87) PCT Pub. No.: WO98/11449

PCT Pub. Date: Mar. 19, 1998

Related U.S. Application Data

(60) Provisional application No. 60/026,088, filed on Sep. 13, 1996.

(51) Int. Cl.
*G01R 31/02* (2006.01)

(52) U.S. Cl. .................. 324/784; 324/755; 324/761

(58) Field of Classification Search ........ 324/754–762; 439/59–66, 91, 71, 591
See application file for complete search history.

(56) References Cited

U.S. PATENT DOCUMENTS

| | | | | |
|---|---|---|---|---|
| 3,795,037 | A | * | 3/1974 | Luttmer ..................... 439/591 |
| 5,225,777 | A | * | 7/1993 | Bross ......................... 324/754 |
| 5,371,654 | A | * | 12/1994 | Beaman et al. ............ 361/744 |
| 5,810,607 | A | * | 9/1998 | Shih et al. ................... 439/66 |

FOREIGN PATENT DOCUMENTS

| | | |
|---|---|---|
| JP | 58-165056 | 9/1983 |
| JP | 4-51662 | 4/1992 |
| JP | 4-240570 | 8/1992 |
| JP | 5-55319 | 3/1993 |

(Continued)

*Primary Examiner*—Vinh P Nguyen
(74) *Attorney, Agent, or Firm*—Thomas A. Beck; Daniel P. Morris

(57) ABSTRACT

A structure useful as a probe for testing electrical interconnections to integrated circuit devices and other electronic components having a substrate with a bond wire elongated electrical conductor extending away from the surface of the substrate. Each of the bond wire elongated electrical conductors has a first end affixed to the surface at an electrical contact location and a multitude of second ends projecting away from the surface. The first end and said second end of bond wire elongated electrical connector has a ball-shaped protuberance positioned thereon and there existsa in the system means for permitting each of the second ends to move about reference positions.

The element which contains means for permitting each of the second ends to move about reference positions is a sheet of material having a plurality of through-holes therein through which the second ends project. There is a perforation in each said sheet in the vicinity of said openings.

39 Claims, 19 Drawing Sheets

FOREIGN PATENT DOCUMENTS

| | | |
|---|---|---|
| JP | 06082481 A | 3/1994 |
| JP | 06204399 A | 7/1994 |
| JP | 06300783 A | 10/1994 |
| JP | 07301642 A | 11/1995 |
| JP | 07321490 | 12/1995 |
| JP | 09061461 A | 3/1997 |
| JP | 09229963 A | 9/1997 |
| JP | 09281145 A | 10/1997 |
| JP | 09304472 A | 11/1997 |
| JP | 10019931 A | 1/1998 |
| WO | WO95/14314 | 5/1995 |
| WO | WO96/14659 | 5/1996 |
| WO | WO96/14660 | 5/1996 |
| WO | WO96/17378 | 6/1996 |

\* cited by examiner

WAFER SCALE HIGH DENSITY PROBE ASSEMBLY, APPARATUS FOR USE THEREOF AND METHODS OF FABRICATION THEREOF

This application claims priority from Provisional Application U.S. Ser. No. 60/026,088 which was filed on Sep. 13, 1996.

CROSS REFERENCE TO RELATED APPLICATION

The teaching of U.S. application Ser. No. 09/254,768 now U.S. Pat. No. 6,528,984, filed on the same day herewith entitled, "INTEGRATED COMPLIANT PROBE FOR WAFER LEVEL TEST AND BURNIN" to Brian S. Beaman et al. and the teaching of U.S. application Ser. No. 09/254,798 now U.S. Pat. No. 6,452,406 filed on the same day herewith entitled, "PROBE STRUCTURE HAVING A PLURALITY OF DISCRETE INSULATED PROBE TIPS PROJECTING FROM A SUPPORT SURFACE, APPARATUS FOR USE THEREOF AND METHODS OF FABRICATION THEREOF" to Brian S. Beaman et al. is incorporated herein by reference.

FIELD OF THE INVENTION

The present invention is directed to structures useful as probes for testing of electrical interconnections to integrated circuit devices and other electronic components and particularly to testing of integrated circuit devices with rigid interconnection pads and multi-chip module packages with high density interconnection pads.

BACKGROUND OF THE INVENTION

Integrated circuit (IC) devices and other electronic components are normally tested to verify the electrical function of the device and certain devices require high temperature burn-in testing to accelerate early life failures of these devices. Wafer probing is typically done on a single chip site at temperatures ranging from 25C–125C while burn-in is typically done on diced and packaged chips at temperatures ranging from 80C to 140C. Wafer probing and IC chip burn-in at elevated temperatures of up to 200C has several advantages and is becoming increasingly important in the semiconductor industry. Simultaneous testing of multiple chips on a single wafer has obvious advantages for reducing costs and increasing production thruput and is a logical step towards testing and burn-in of an entire wafer.

The various types of interconnection methods used to test these devices include permanent, semi-permanent, and temporary attachment techniques. The permanent and semi-permanent techniques that are typically used include soldering and wire bonding to provide a connection from the IC device to a substrate with fan out wiring or a metal lead frame package. The temporary attachment techniques include rigid and flexible probes that are used to connect the IC device to a substrate with fan out wiring or directly to the test equipment.

The permanent attachment techniques used for testing integrated circuit devices such as wire bonding to a leadframe of a plastic leaded chip carrier are typically used for devices that have low number of interconnections and the plastic leaded chip carrier package is relatively inexpensive. The device is tested through the wire bonds and leads of the plastic leaded chip carrier and plugged into a test socket. If the integrated circuit device is defective, the device and the plastic leaded chip carrier are discarded.

The semi-permanent attachment techniques used for testing integrated circuit devices such as solder ball attachment to a ceramic or plastic pin grid array package are typically used for devices that have high number of interconnections and the pin grid array package is relatively expensive. The device is tested through the solder balls and the internal fan out wiring and pins of the pin grid array package that is plugged into a test socket. If the integrated circuit device is defective, the device can be removed from the pin grid array package by heating the solder balls to their melting point. The processing cost of heating and removing the chip is offset by the cost saving of reusing the pin grid array package.

The most cost effective techniques for testing and burn-in of integrated circuit devices provide a direct interconnection between the pads on the device to a probe sockets that is hard wired to the test equipment. Contemporary probes for testing integrated circuits are expensive to fabricate and are easily damaged. The individual probes are typically attached to a ring shaped printed circuit board and support cantilevered metal wires extending towards the center of the opening in the circuit board. Each probe wire must be aligned to a contact location on the integrated circuit device to be tested. The probe wires are generally fragile and easily deformed or damaged. This type of probe fixture is typically used for testing integrated circuit devices that have contacts along the perimeter of the device. This type of probe is also much larger than the IC device that is being tested and the use of this type of probe for high temperature testing is limited by the probe structure and material set.

Another technique used for testing IC devices comprises a thin flex circuit with metal bumps and fan out wiring. The bumps are typically formed by photolithographic processes and provide a raised contact for the probe assembly. The bumps are used to contact the flat or recessed aluminum bond pads on the IC device. An elastomer pad is typically used between the back of the flex circuit and a pressure plate or rigid circuit board to provide compliance for the probe interface. This type of probe is limited to flexible film substrate materials that typically have one or two wiring layers. Also, this type of probe does not provide a wiping contact interface to ensure a low resistance connection.

The aluminum bond pads on a high density IC device are typically rectangular in shape and are recessed slightly below the surface of the passivation layer. If the wiping action of the high density probe is not controlled, the probe contact may move in the wrong direction and short to an adjacent aluminum bond pad or the probe contact may move off of the aluminum bond pad onto the surface of the passivation layer and cause an open connection.

Gold plated contacts are commonly used for testing and burn-in of IC devices. The high temperature test environment can cause diffusion of the base metal of the probe into the gold plating on the surface. The diffusion process creates a high resistive oxide layer on the surface of the probe contact and reduces the probe life.

The position of the probe tips must be controlled to ensure accurate alignment of the probes to the interconnection pads on the IC device. During high temperature burn-in testing, the thermal expansion mismatch between the probe structure and the IC device must be small to ensure that the probe position does not vary significantly over the burn-in temperature range. Thermal expansion mismatch within the probe structure can result in contact reliability problems.

The challenges of probing a single high density integrated circuit device are further multiplied for multi-chip and full wafer testing applications. Probe fabrication techniques and material selection are critical to the thermal expansion and contact alignment considerations. A small difference in the thermal expansion of the substrate, wafer, and probe construction will cause misalignment of the probe tip to the wafer contact pad. Compliance of the probe structure is another critical factor. Slight variations in the wafer metalization, warpage of the wafer, and slight variations in the probe height contribute to the total compliance requirements for the probe structure.

U.S. Pat. No. 5,177,439, issued Jan. 5, 1993 to Liu et al., is directed to fixtures for testing bare IC chips. The fixture is manufactured from a silicon wafer or other substrate that is compatible with semiconductor processing. The substrate is chemically etched to produce a plurality of protrusions to match the I/O pattern on the bare IC chip. The protrusions are coated with a conductive material and connected to discrete conductive fanout wiring paths to allow connection to an external test system. The probe geometry described in this patent does not provide a compliant interface for testing the aluminum bond pads on the IC device and does not provide a wiping contact interface. The substrate used for fabrication of this probe fixture is limited to semiconductor wafers which are relatively expensive. The high density probe with controlled wipe can be fabricated on a variety of inexpensive substrate with the fanout wiring.

IBM Docket #YO993028 describes a high density test probe for integrated circuit devices. The probe structure described in this docket uses short metal wires that are bonded on one end to the fan out wiring on a rigid substrate. The wires are encased in a compliant polymer material to allow the probes to compress under pressure against the integrated circuit device. The wire probes must be sufficiently long and formed at an angle to prevent permanent deformation during compression against the integrated circuit device. The probe structure described in this patent does not provide a means of controlling the direction and length of the wiping action of the contact interface.

IBM Docket #YO995-113 describes a high density test probe for integrated circuit devices with aluminum bond pads. The probe structure described in this patent does is subject to contact reliability problems due to the thermal expansion mismatch between the metal wire conductor and the elastomer material surrounding the wires. At high temperatures, the elastomer material expands sufficiently to cause an open connection between the metal wire probes and the IC bond pads. Also, after repeated thermal cycles, the ends of the probe wires are sufficiently exposed above the surface of the elastomer material to be deformed during a subsequent contact cycle with the bond pads on an IC device.

OBJECTS

It is the object of the present invention to provide a probe for testing integrated circuit devices and other electronic components that use bond pads for the interconnection means.

Another object of the present invention is to provide a probe structure that is an integral part of the fan out wiring on the test substrate or other printed wiring means to minimize the electrical conductor length as well as the contact resistance of the probe interface.

A further object of the present invention is to provide a probe with a compliant interface to compensate for slight variations in the rigid bond pad heights on the IC device and variations in the height of the probe contacts.

An additional object of the present invention is to provide a raised probe tip for contacting recessed surfaces on the IC device.

Yet another object of the present invention is to provide a probe with a wiping contact interface where the direction and length of the contact wipe is controllable.

Yet a further object of the present invention is to provide a probe construction that has thermal expansion characteristics that are matched to the IC device to be tested or burned-in at high temperature.

Yet an additional object of the present invention is to provide a probe construction that has high durability and reliability for repeated thermal and mechanical cycling.

Yet another object of the present invention is to provide a probe structure that can be used for single chip or multiple chip wafer testing.

SUMMARY OF THE INVENTION

A broad aspect of the present invention is a structure having a substrate having a surface; a plurality of elongated electrical conductors extending away from the surface; each of the elongated electrical conductors having a first end affixed to said surface and a second end projecting away from the surface; there being a plurality of the second ends; and a means for permitting each of the plurality of second ends to move about reference positions.

According to a more specific aspect of the structure according to the present invention is the means for permitting is a sheet of material having a plurality of opening therein through which the second ends project, therebeing a perforation in the sheet in the vicinity of said openings permitting the second ends to move when the structure is used to electrically probe an electronic device.

According to a more specific aspect of the present invention the perforation are a plurality independent perforations about each of said through-hole.

According to a more specific aspect of the present invention the plurality of interconnected perforations about each of said through-holes.

According to another broad aspect of the present invention the structures according to the present invention are incorporated into an apparatus to test an electronic device having a means for holding the structure of 1, means for retractably moving the structure 1 towards and away from the electronic device so that the second ends contact electrical contact locations on said electronic device, and means for applying electrical signals to the elongated electrical conductors.

Another broad aspect of the present invention as a method of providing a substrate having a surface; forming a plurality of elongated electrical conductors extending away from the surface; each of the elongated electrical conductors having a first end fixed to the surface and a second end projecting away from the surface; there being a plurality of said second ends; and providing a means for permitting each of the plurality of second ends to move about reference positions.

BRIEF DESCRIPTION OF THE DRAWINGS

These and other objects, features, and advantages of the present invention will become apparent upon further consideration of the following detailed description of the invention when read in conjunction with the drawing figures, in which.

DETAILED DESCRIPTION OF THE PREFERRED EMBODIMENT

Preferred Embodiment

Figure 1:
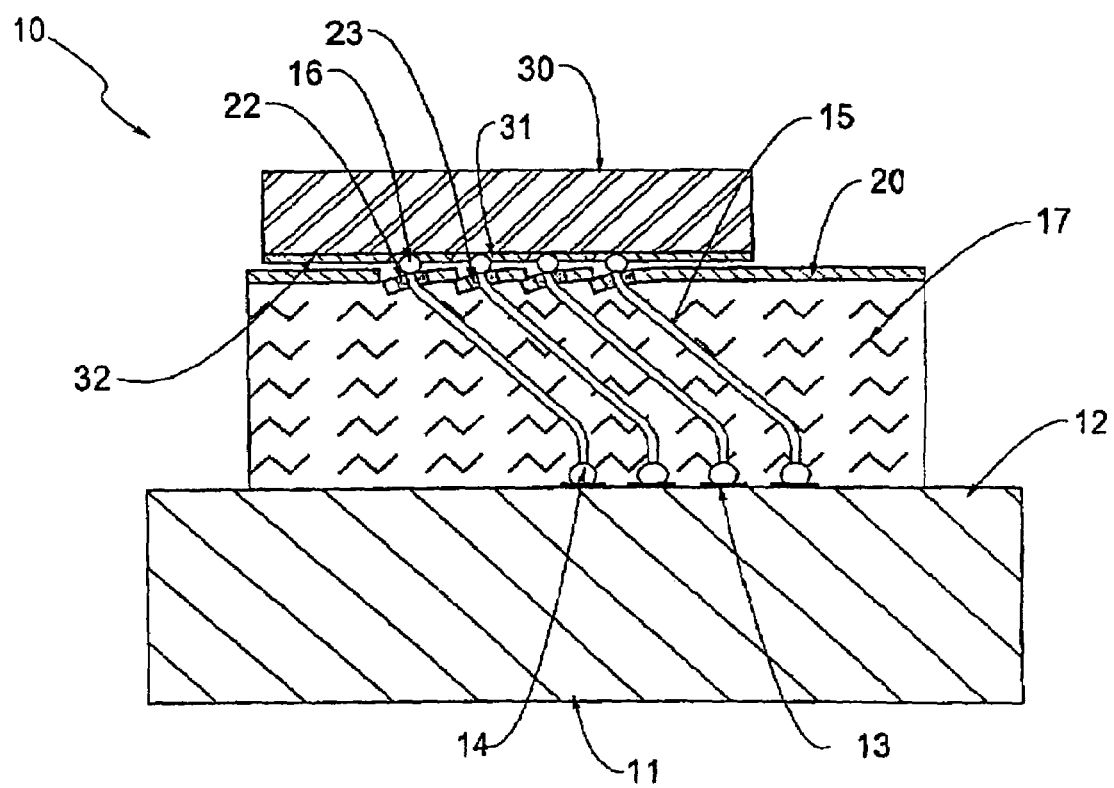
FIG. 1 shows a cross section of an integrated cantilever compliant test probe attached to a substrate and pressed against the aluminum bond pads on an integrated circuit device.

FIG. 1 shows a cross section of a test substrate (11) and an integrated cantilever compliant test probe (10) according to the present invention. The test substrate (11) provides a rigid base for attachment of the probes (10) and fan out wiring from the high density array of probe contacts to a larger grid of pins or other interconnection means to the equipment used to electrically test the integrated circuit device. The fan out substrate can be made from various materials and constructions including single and multi-layer ceramic with thick or thin film wiring, silicon wafer with thin film wiring, or epoxy glass laminate construction with high density copper wiring. The test probes (10) are attached to the first surface (12) of the substrate (11). The probes are used to contact the bond pads (31), typically aluminum bond pads, on the electronic device, typically an integrated circuit device (30). The bond pads (31) are typically recessed slightly below the surface of the passivation layer (32) of the electronic device (30). The geometry of the integrated cantilever compliant test probe (10) is optimized to provide a wiping contact interface to penetrate the oxides on the surface of the bond pads (31) to provide a low resistance connection.

Figure 2:
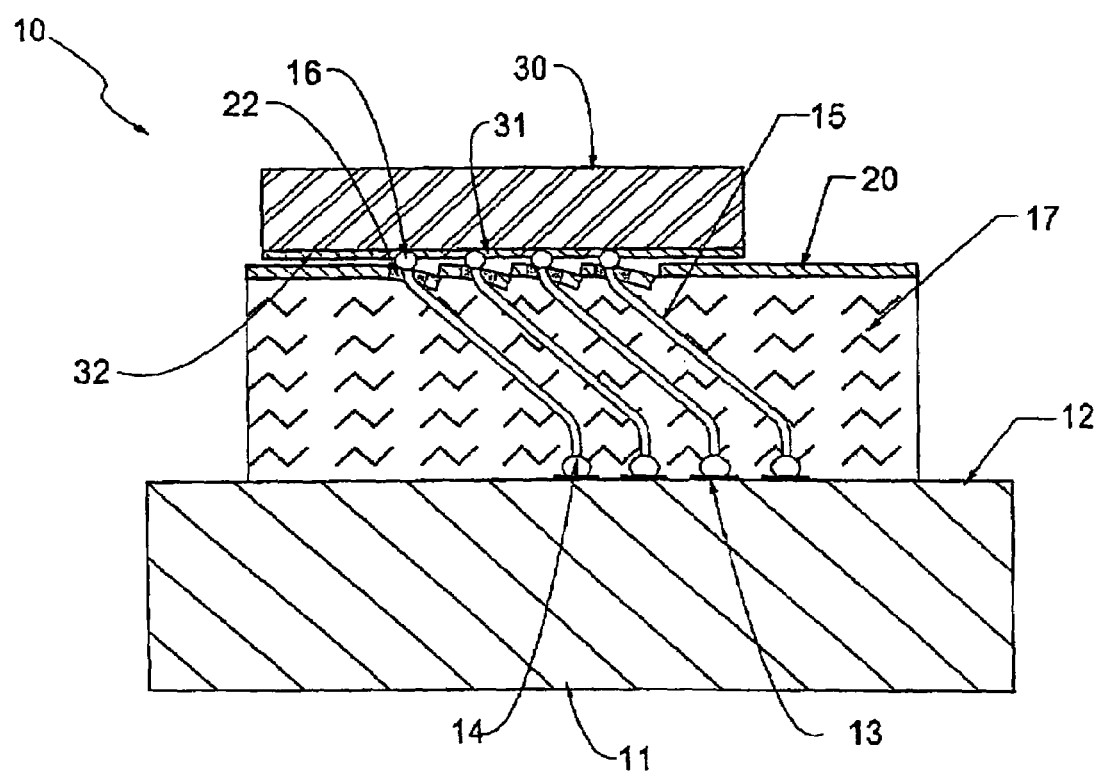
FIG. 2 is essentially the same as FIG. 1 with a modified arrangement of the cantilevered flap.

FIG. 2 is essentially the same as FIG. 1 with a modified arrangement of the cantilevered flap in the polymer material. The test probe (10) is attached directly to the fan out wiring (13) on the first surface (12) of the substrate (11) to minimize the resistance of the probe interface. The probe geometry is optimized to provide a flexible contact interface that controls the direction and length of the wiping action. The elastomer material (17) preferably surrounding the probes provides an compliant structure and the cantilevered flaps (23) in the thin polymer sheet (18) are used to the controls the direction and length that the probe tip (16) can wipe against the aluminum bond pads (31) on the IC device (30). The probe tip (16) is bonded to the cantilevered flap (23) using a suitable epoxy material (22). As the high density probe (10) is pressed against the IC device (30), the probe wire (15) and the cantilevered flap (23) rotate and the probe tip (16) slides along the surface of the bond pads (31) of the IC device (30). The probe tip ends (16) move about a reference position that is the position probe tip ends have when the probe tip ends are not pressed against a device under test.

The length of the sliding or wiping action is restricted by the angle and length of the probe wire (15) and the length of the cantilevered flap (23) in the sheet (20). Sheet (20) is preferably of a polymer material.

Figure 3:
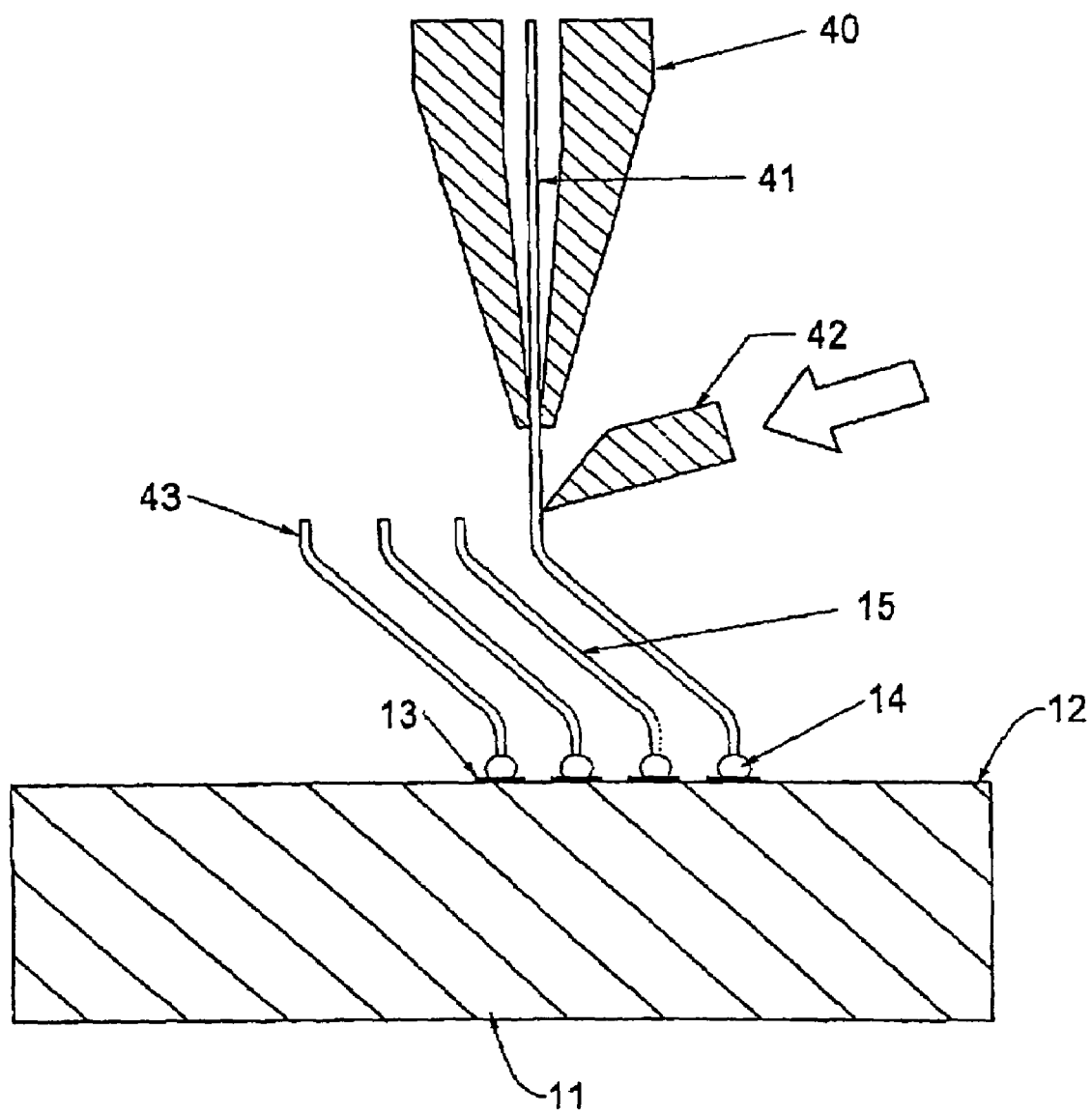
FIGS. 3–6 show the processes used to fabricate the integrated cantilever test probe on a fan out wiring substrate.

FIG. 3 shows a process used to fabricate the integrated cantilever compliant test probe. A thermosonic wire bonder tool is used to attach ball bonds (14) to the fan out wiring (13) on the first surface (12) of the rigid substrate (11). The wire bonder tool uses a first ceramic capillary (40) to press the ball shaped end of the bond wire (41) against the first surface (12) of the substrate (11). Compression force and ultrasonic energy are applied through the first capillary (40) tip and thermal energy is applied from the wire bonder stage through the substrate (11) to bond the ball shaped end of the bond wire (41) to the fan out wiring (13) on the first surface (12) of the substrate (11). The bond wire (41) is positioned at an angle and a shear blade (42) is used to sever the bond wire (41) to create an angled segment of wire (15) protruding vertically from the ball bond (14). The movement of the ceramic capillary (40) is controlled during this process to provide a short straight section of the wire (43) that is perpendicular to the surface of the rigid substrate (10).

Figure 4:
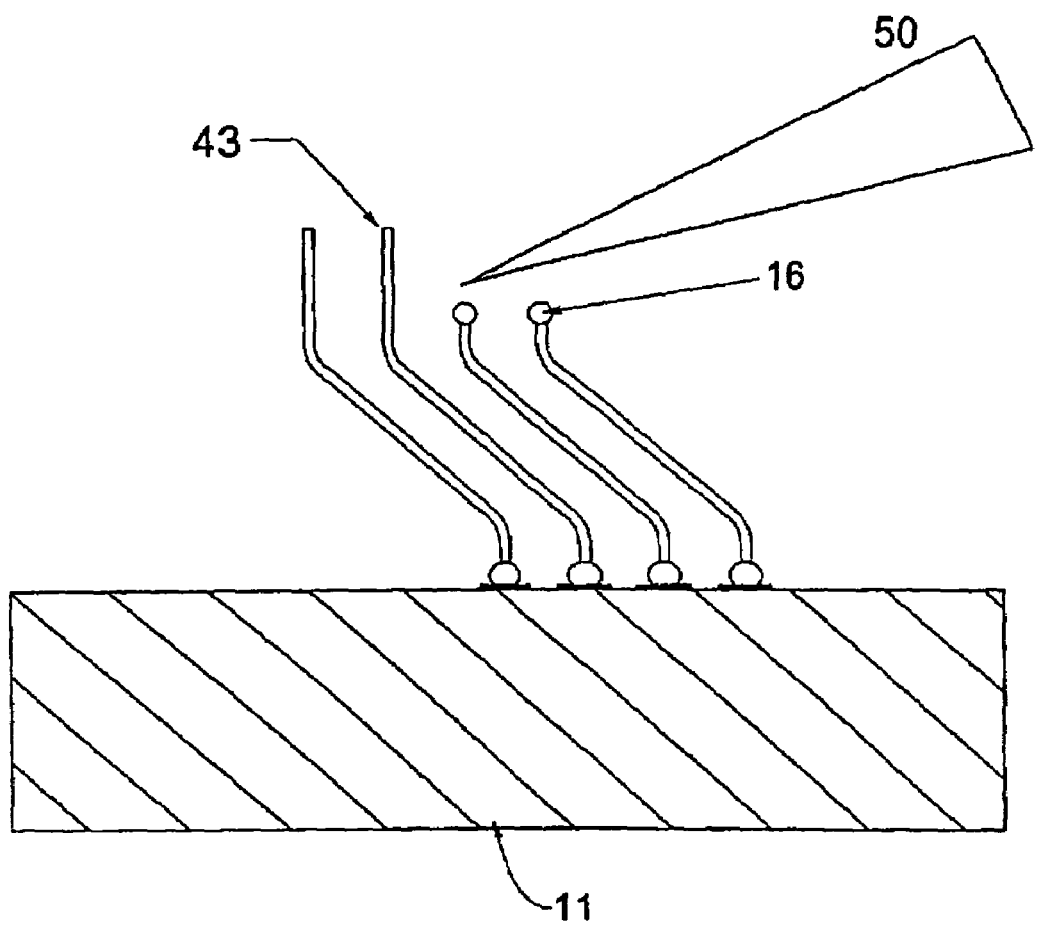

FIG. 4 shows a laser (50) (preferably an argon ion laser) used to melt the ends of the short straight sections of the wire (15) to create a ball shaped contact (16). The smooth surface of the ball shaped contact (16) is ideal for a wiping interface. The size of the ball shaped contact (16) on the end of the probe is controlled by the laser power density and the alignment of the focal point from the tip of the straight wire section (43). The shape at the end of the wire can be any shaped protuberance such as, for example, a ball with a barbed or pointed end or a shaft pointed end.

Figure 5:
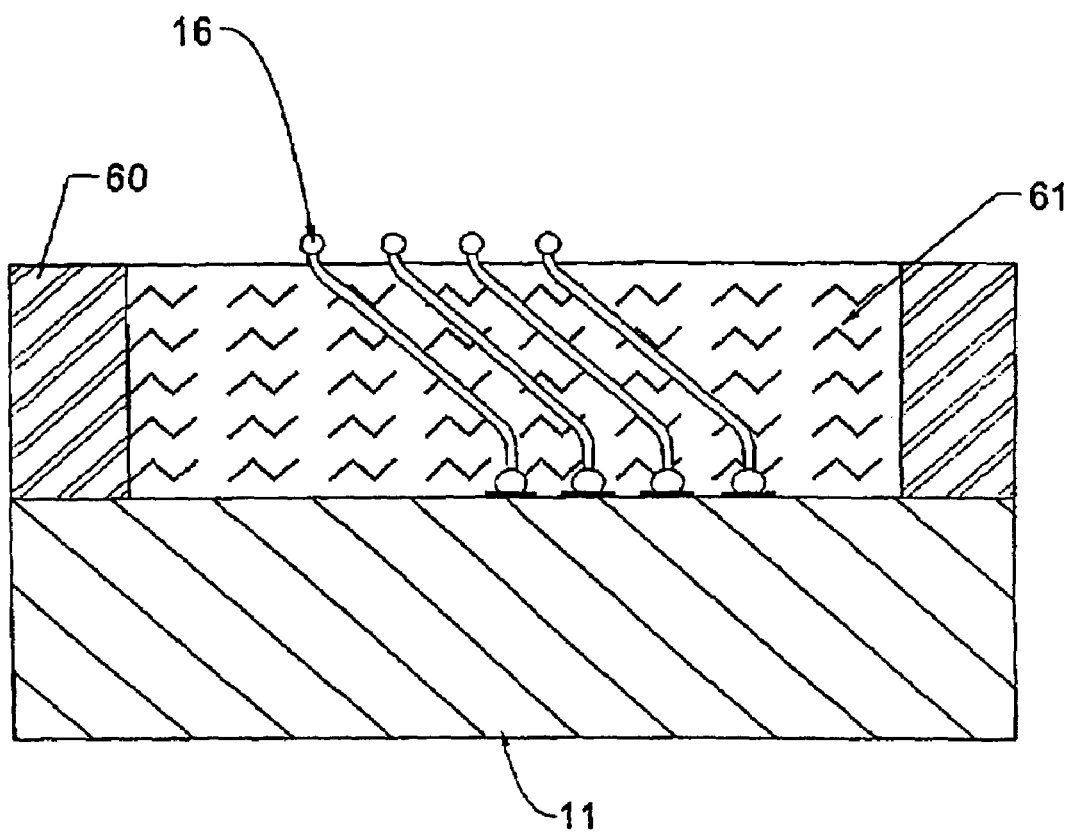
Figure 6:
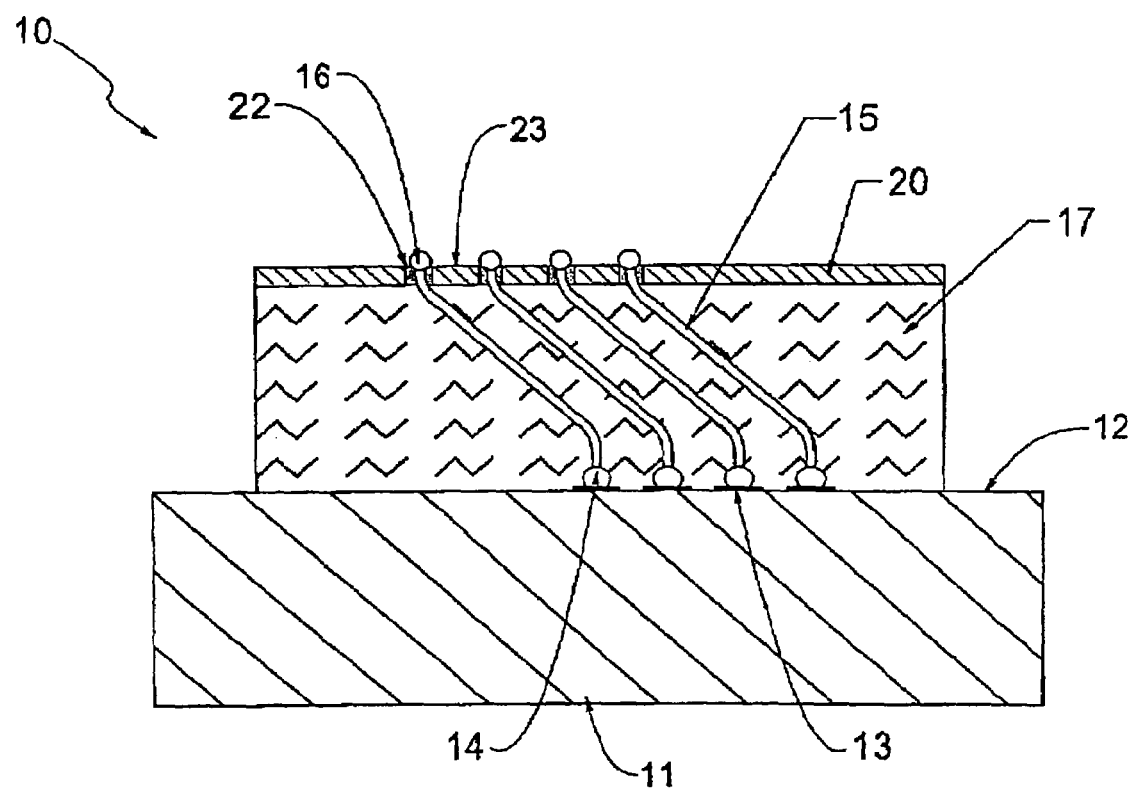

FIG. 5 shows a casting dam (60) placed around the array of high density probes. The casting dam (60) is used to contain the liquid elastomer (61) until it is cured. A controlled volume of liquid elastomer resin (61) is dispensed into the cavity and allowed to settle out before curing. The height of the elastomer material (61) is controlled so that ball shaped end of the probe (16) is slightly above the surface of the elastomer (61). Once the elastomer has cured, the casting dam (60) is removed and a sheet (20) with cantilever flats (23) and corresponding openings is placed over the ball shaped ends (16) of the probes as shown in FIG. 6. The sheet (20) is preferably a polymer sheet. An epoxy material (22) is applied to the openings in the polymer sheet (20) and cured to bond the probe to the cantilevered flaps (23).

Figure 6A:
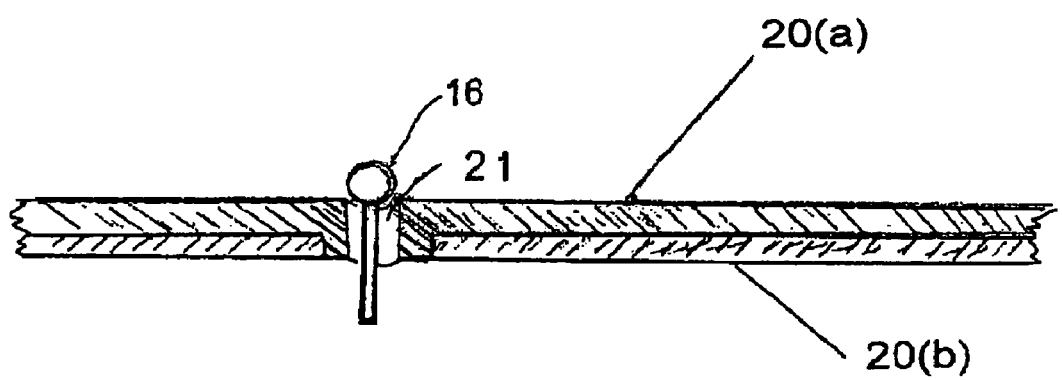

FIG. 6a depicts an alternate embodiment of FIG. 6. Sheet 20 comprises two distinct layers 20a, a dielectric material, e.g. a polymer such as polyimide and 20b which is an electrically conducting layer of metal. This composite sheet 20a and 20b in FIG. 6a has a plurality (not shown) of openings 21 (holes) therethrough of the type depicted. Ball 16 is insulated from contacting the metallic sheet 20b by the dielectric material extending into opening 21.

Figure 7:
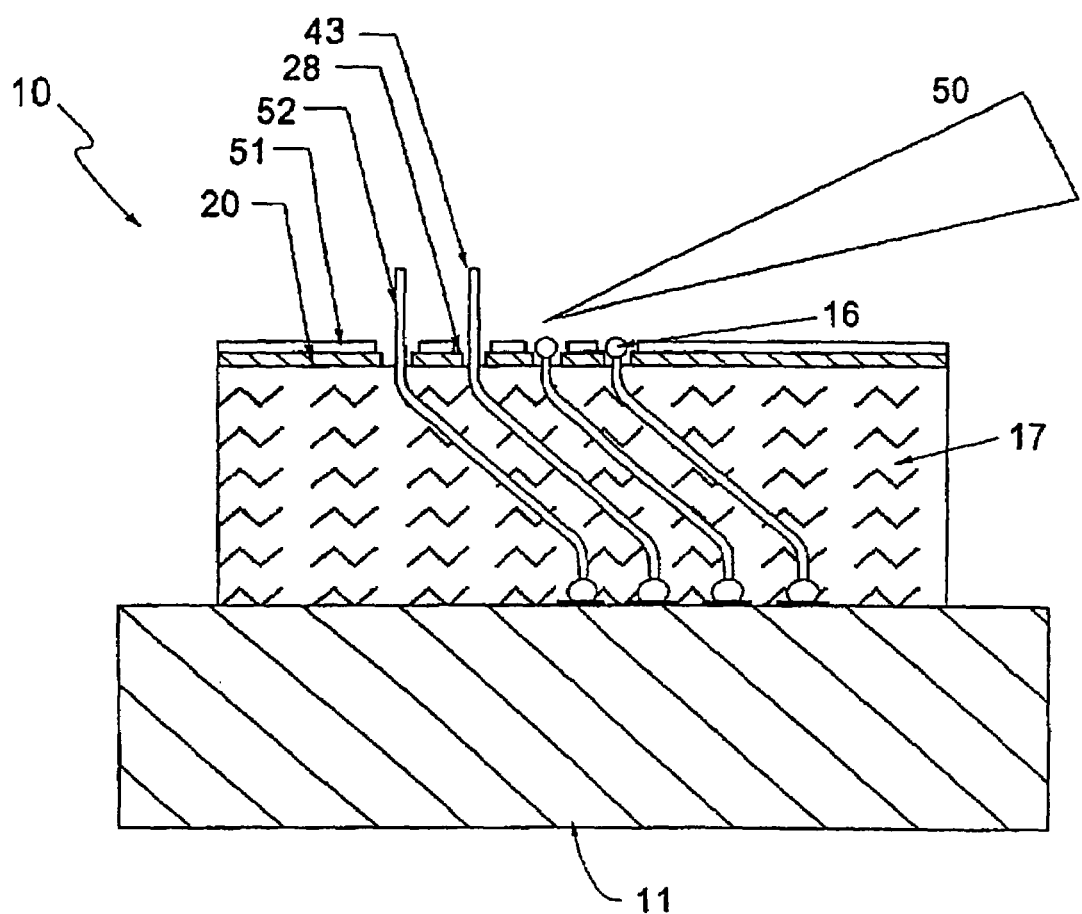
FIG. 7 shows an alternate process used to fabricate the integral cantilever compliant test probe.

FIG. 7 shows another process according to the present invention used to fabricate the integral cantilever compliant test probe (100). The sequence of the fabrication process is changed in order to cast and cure the elastomer resin before the laser ball forming process. After the elastomer (17) is cast and cured, a thin polymer sheet (20) with small opening (28) corresponding to the probe locations is place over the straight ends of the probe wires (43). A (preferably thin metal) mask (51) with larger openings (52) corresponding to the probe locations is also placed over the ends of the probe wires (43). After the (preferably argon-ion) laser (50) is used to form the ball shaped (16) ends on the probe wires, the metal mask (51) is removed from the top surface of the probe structure (100). The mask (51) prevents polymer sheet (20) from being exposed to the light of laser (50). The mask (51) can be of any light blocking material such as metal, ceramic, glass, polymer and combinations thereof.

Figure 8:
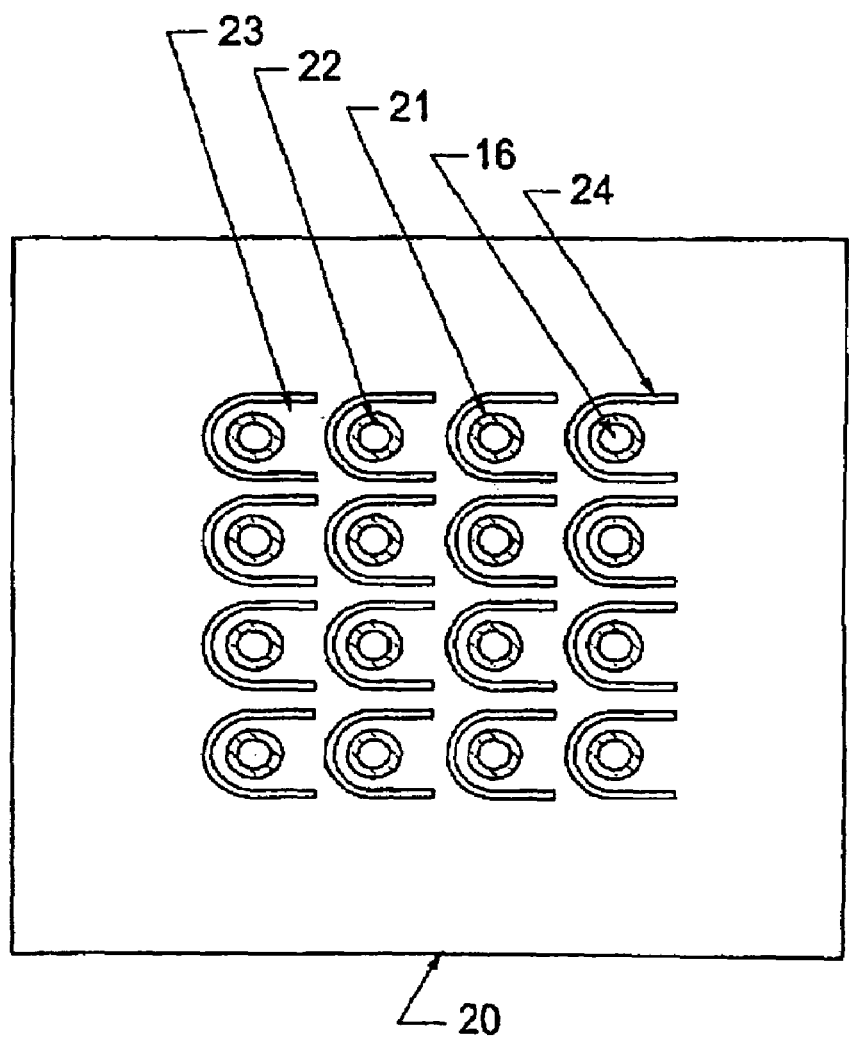
FIG. 8 shows a top view of the preferred embodiment of a integrated cantilever compliant test probe.

FIG. 8 shows a top view of the test probe and the cantilevered flaps (23) in the sheet (20) that is attached to the top of the layer of elastomer material (17). Openings (21) in the sheet (20) are aligned with the ball shaped ends (16) of the probes and preferably bonded to the polymer sheet using an epoxy material. The accuracy of the location of the ball shaped probe contacts (16) is determined by the accuracy of the location of the openings (21) in the polymer sheet (20). The sheet (20) material is preferably selected to match the thermal coefficient of expansion (TCE) of the device or other substrate material of the device to be tested at elevated temperatures. Flap (23) is formed by perforation (24) which is "U" shaped in FIG. 8. Perforation (24) can be any shape such as triangular, a section of a circle, rectangular, polygonal and combinations thereof.

Figure 9:
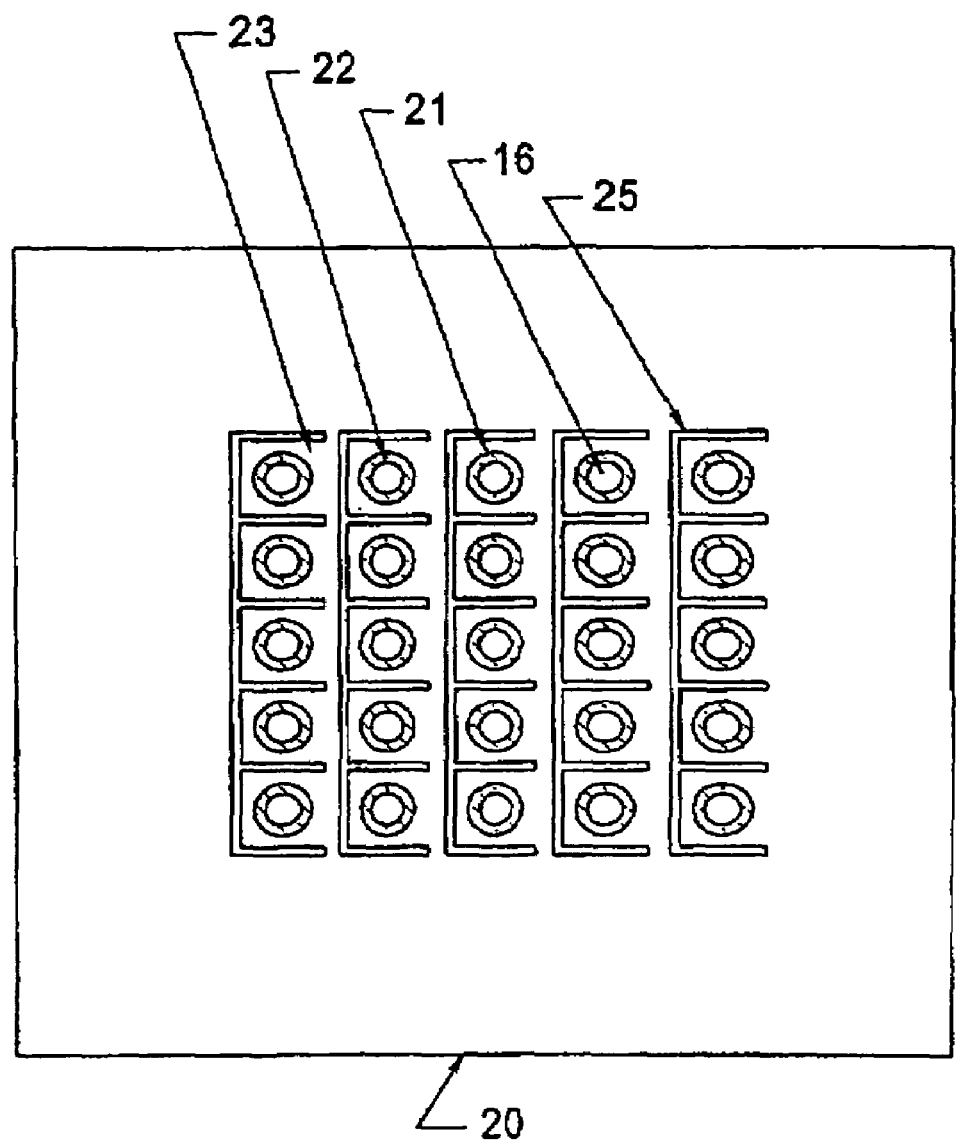
FIG. 9 shows a top view of the preferred embodiment of the integral cantilever compliant test probe with a modified cantilevered flap configuration to allow the probes to be fabricated with a closer spacing.

FIG. 9 shows a top view of an embodiment of the integral cantilever compliant test probe with a modified cantilevered flap (23) configuration to allow the probes to be fabricated with a closer spacing. Other configurations of the cantilever flap are possible to optimize the compliance and spacing requirements of the probe array. Flap (23) if formed by perforation (25) which is a perforation interconnected about a group of openings (22).

Figure 10:
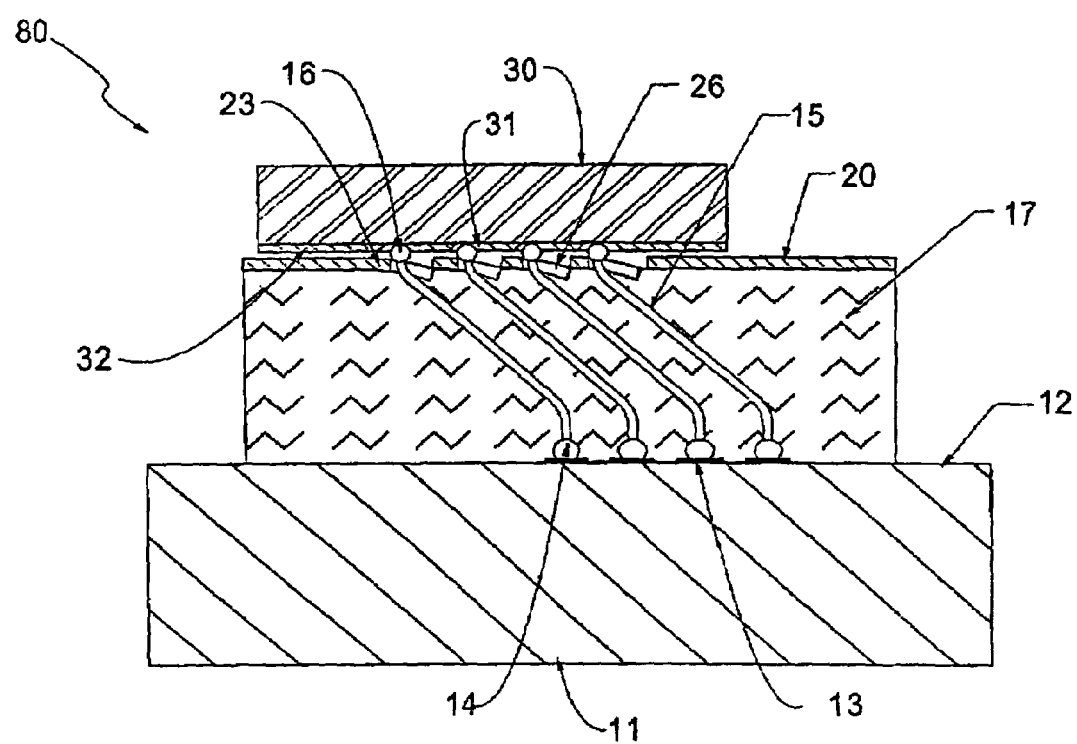
FIG. 10 shows a cross section of an embodiment of the integrated cantilever compliant test probe attached to a substrate and pressed against the aluminum bond pads on an integrated circuit device.
Figure 11:
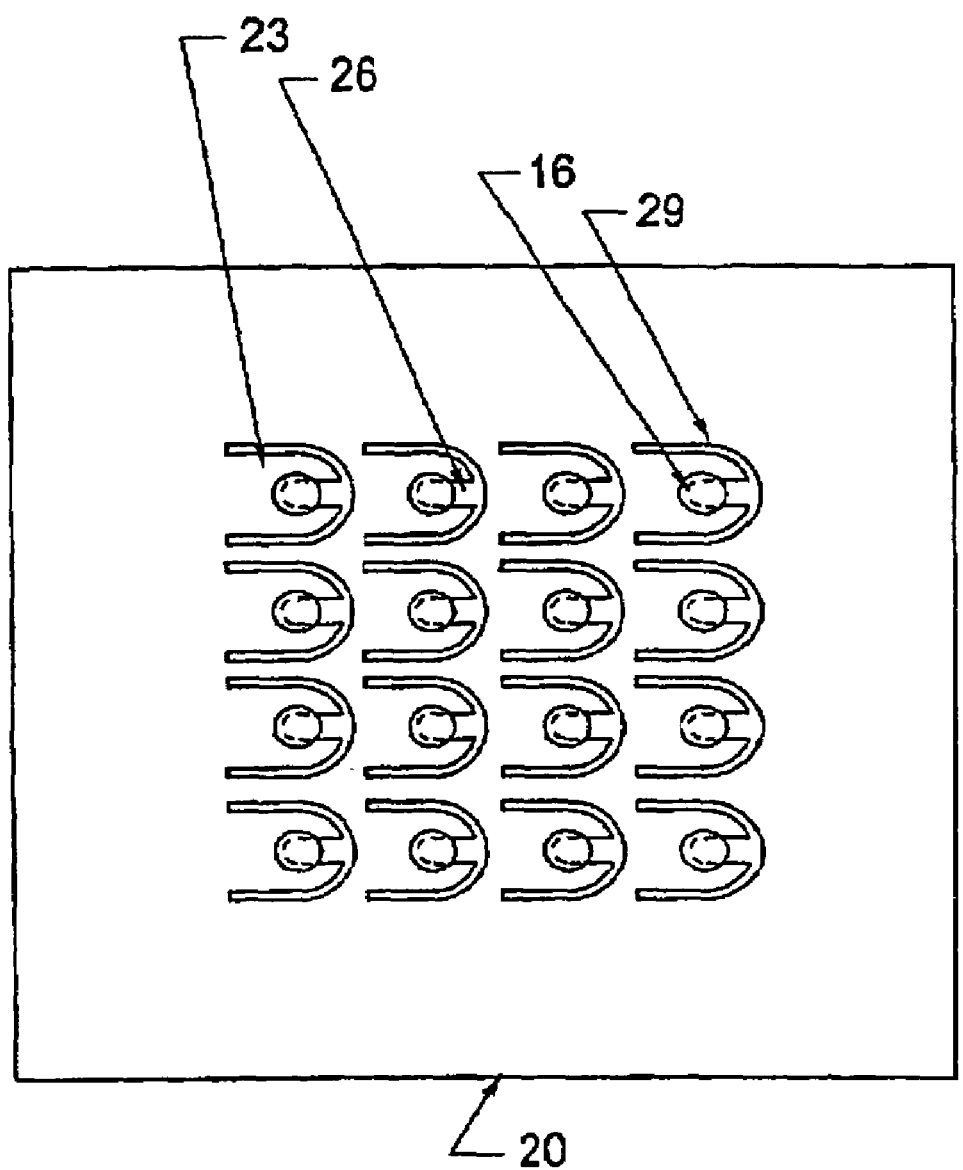
FIG. 11 shows a top view of an embodiment of the integrated cantilever compliant test probe.

FIG. 10 shows another embodiment of the integrated cantilever compliant test probe (80). Instead of bonding the probe wire (15) to the cantilevered flaps (23) in the material (20), the embodiment (80) uses a slotted opening (26) in the cantilevered flaps (23) to control the movement of the probe tip (16). The width of the slot (26) in the cantilevered flap (23) is slightly wider than the diameter of the probe wire (15). The narrow width of the slot (26) prevents the ball shaped probe tip (16) from sinking into the soft elastomer material (17) during compression of the probe structure. FIG. 11 shows a top view of the embodiment of FIG. 10. Again perforation (29) is shown "U" shaped but can be any shape.

Figure 12:
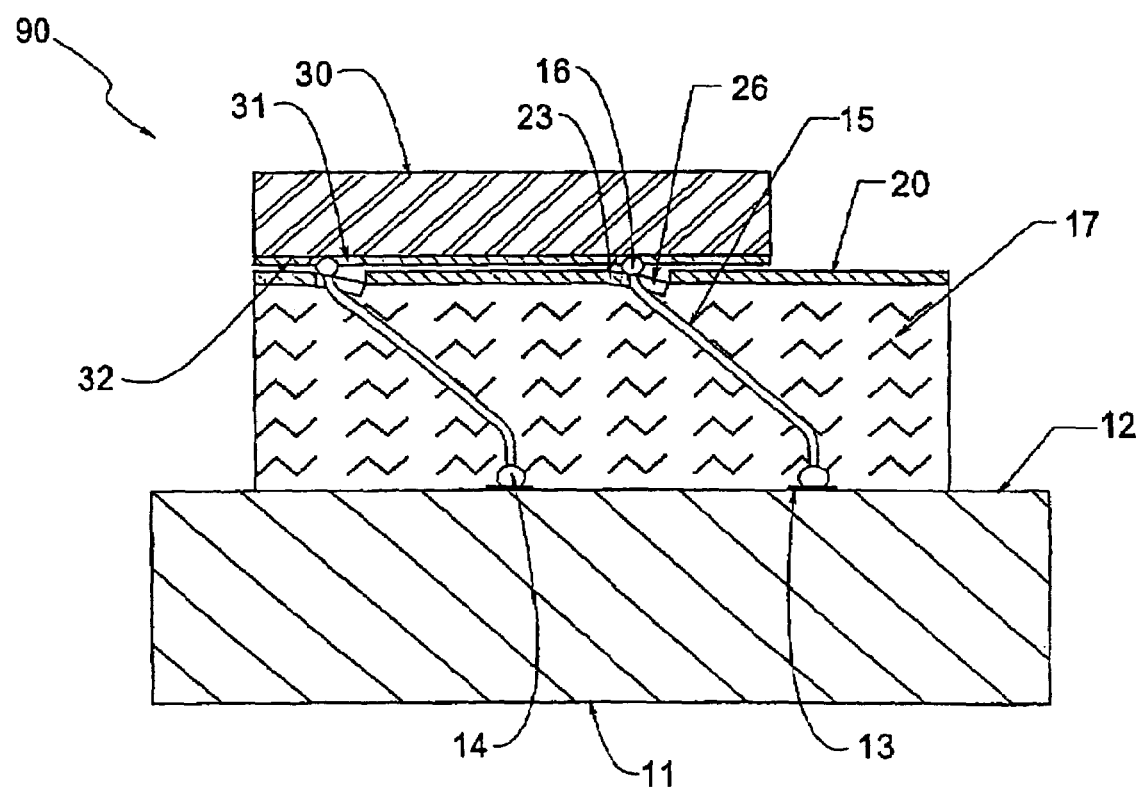
FIG. 12 shows a cross section of an embodiment of the integrated cantilever complaint test probe attached to a substrate and pressed against the aluminum bond pads on an integrated circuit device.
Figure 13:
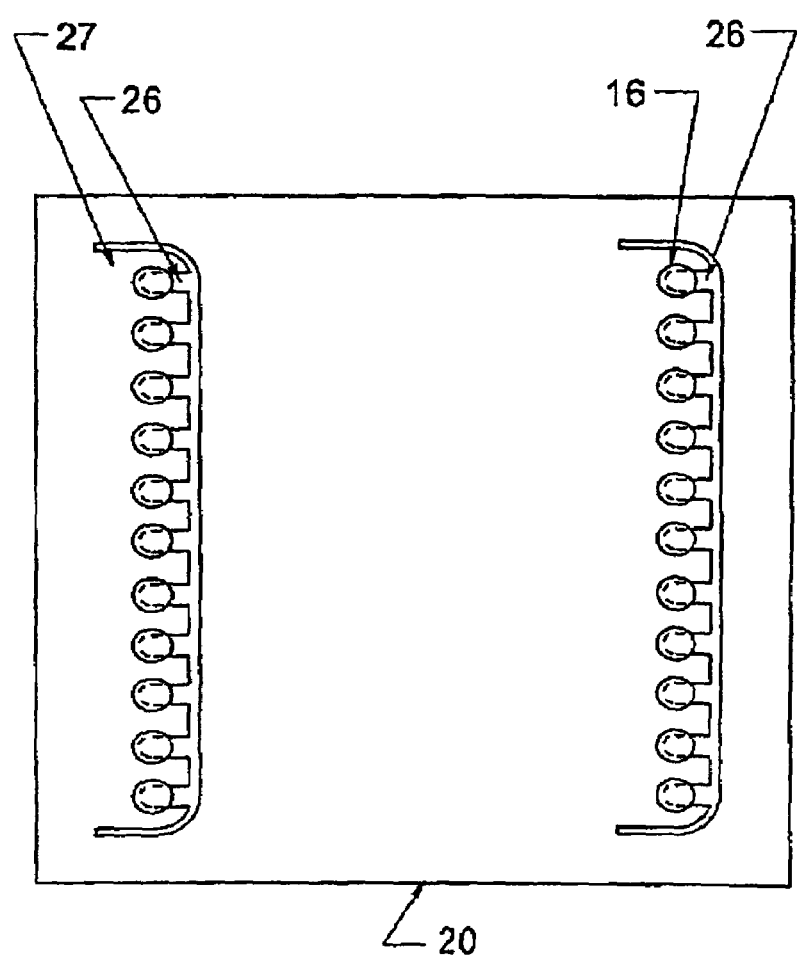
FIG. 13 shows a top view of an embodiment of the integrated cantilever compliant test probe.

FIGS. 12 and 13 show another embodiment of the integrated cantilever compliant test probe (90). The structure of the embodiment (90) is similar to the embodiment (80) of the test probe of FIGS. 10 and 11. The spacing between the probes in one direction is much farther apart than in the opposite direction. The embodiment (90) uses a single cantilevered flap (27) to control several probe wires. Perforation (22) partially surrounds a group of openings or slots (26).

Figure 14:
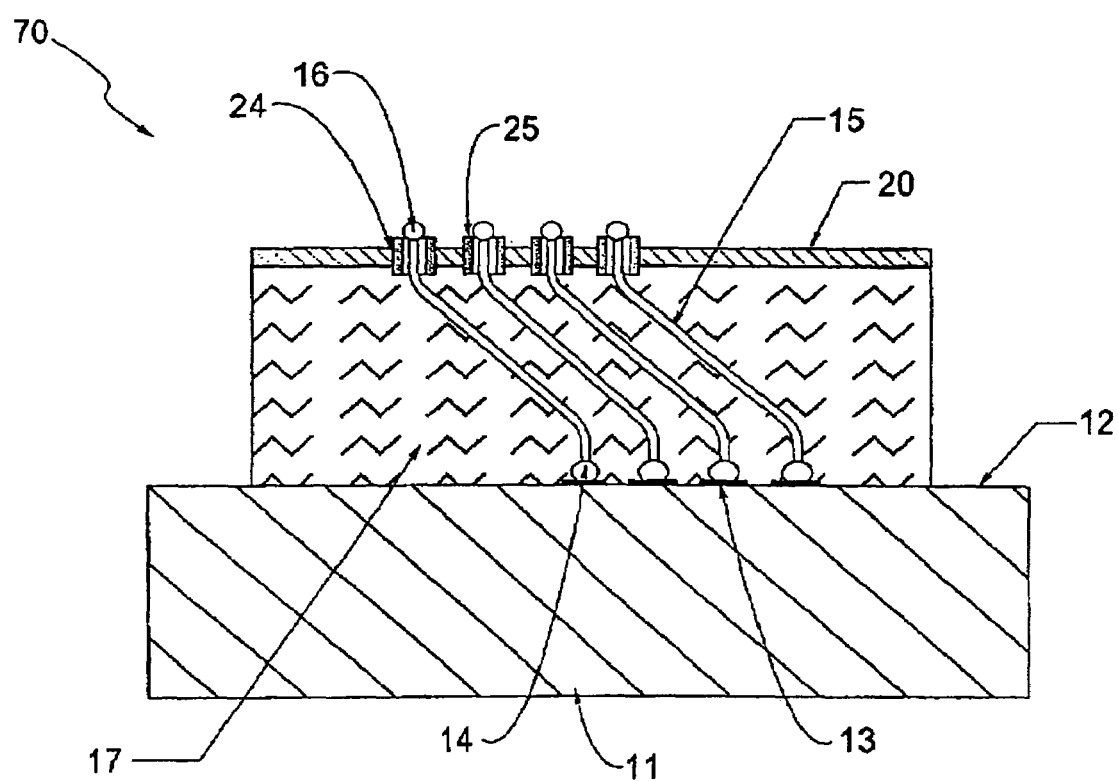
FIG. 14 shows a cross section of an embodiment of the integrated cantilever compliant test probe.

FIG. 14 shows another embodiment of the test probe (70). The embodiment (70) of the test probe does not use a cantilevered flap and the end of the probe (16) is restricted by the collars (25) surrounding each of the probe wires (15). The collars (25) are positioned below the ball shaped ends of the probe tips (16) to prevent the tips (16) from sinking into the soft elastomer material (17) during compression. The collars (25) sit in separate openings (24) in the sheet (20) and allow vertical movement of the probe tips (16) but restrict lateral movement.

Figure 15:
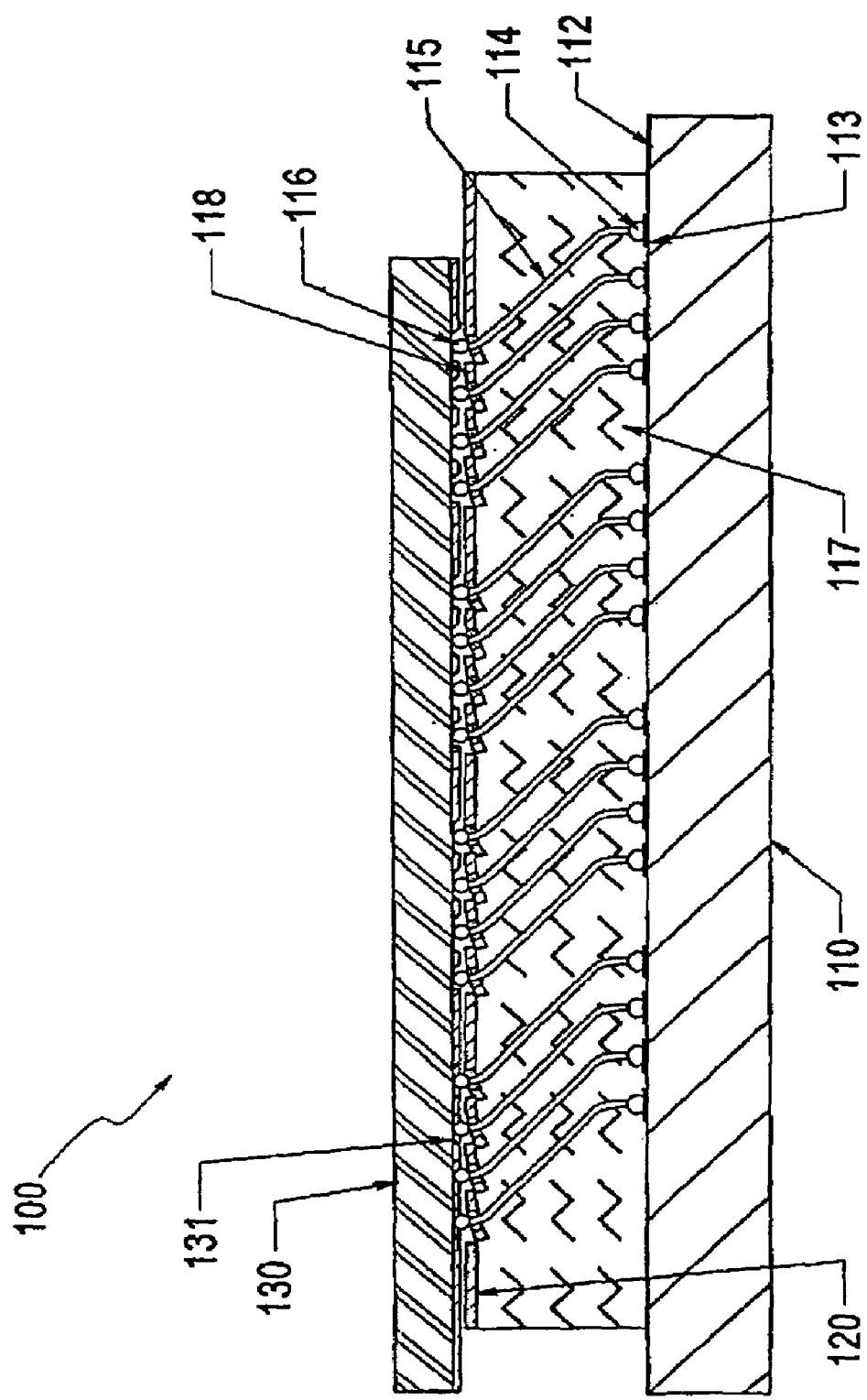
FIG. 15 shows a cross section of an integrated cantilever compliant test probe array for testing multiple IC devices on a single wafer.

FIG. 15 shows a cross section of an integrated cantilever compliant test probe array (100) for testing multiple IC devices on a single wafer. The integrated test probe (100) shown in FIG. 15 includes four distinct probe arrays used to test individual IC devices on the wafer (130). The construction of each distinct probe array is identical to that shown in FIG. 1, but can be any of the embodiments described herein or in the US patent applications and patents incorporated herein by reference. The substrate (110) used as the base for building the test probe has an array of pads (113) on the top surface (112) that matches the pattern of contacts (131) on the wafer (130) to be tested. The test probes are bonded to these pads (113) and formed at an angle or other suitable shape as described in the FIGS. 3 to 6 and 17. The angle or shape of the bond wires (115) are preferably all be the same to ensure accurate positioning of the ball shaped contact (116) on the end of the probe. Likewise, the geometry of the cantilevered sections (118) of the top polymer sheet (120) must be identical to ensure accurate alignment and uniform wiping against the mating contact pads (131) on the wafer (130). Uniform material properties and height of the elastomer material (117) are necessary to provide optimum compliance and contact normal force across the entire surface of the probe array.

Figure 16:
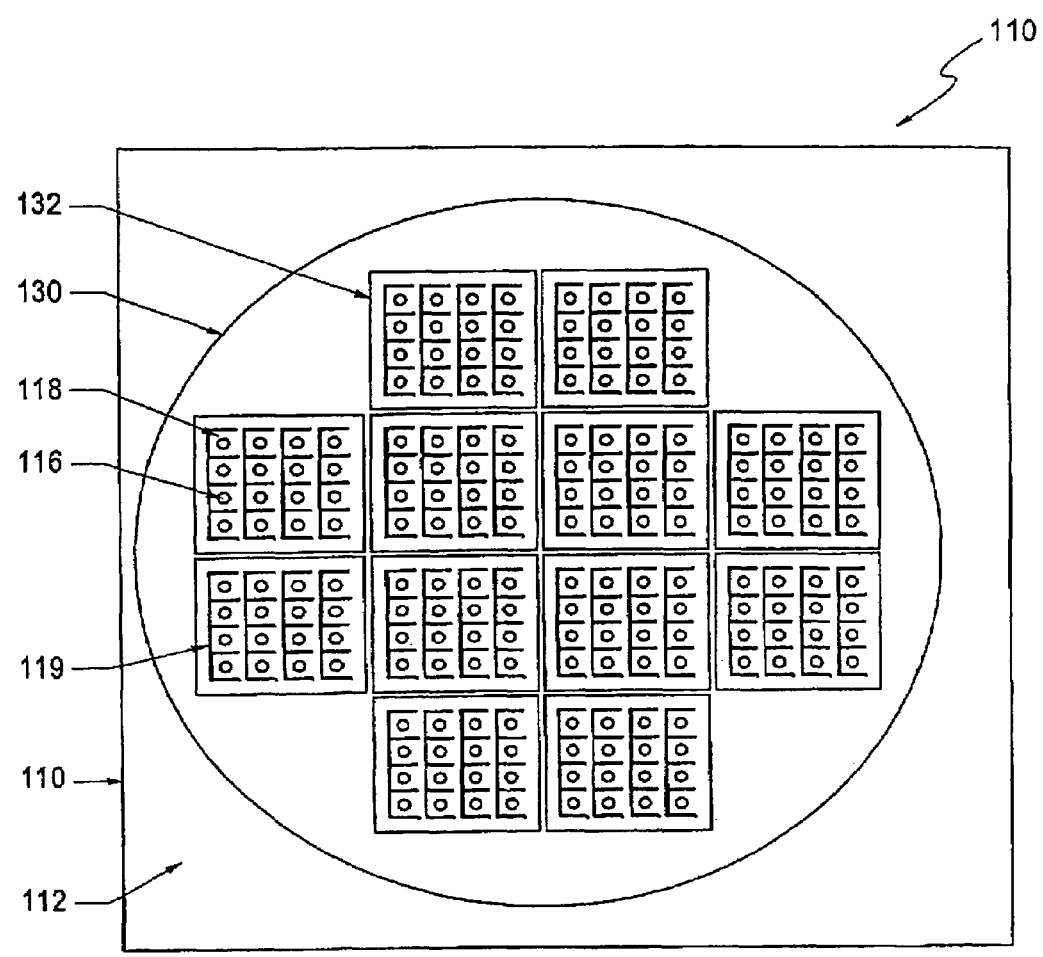
FIG. 16 shows a top view of an integrated cantilever compliant test probe array for testing all of the IC devices on a single wafer.

FIG. 16 shows a top view of an integrated cantilever compliant test probe array (100) for testing all of the IC devices on a single wafer (130). The integrated test probe (100) shown in FIG. 16 includes twelve distinct probe arrays used to test all of the IC devices on the wafer (130). The outline of the wafer (130) and the individual IC devices (132) are shown with broken or dashed lines. The location of each array of probes corresponds with the pads on each of the individual IC devices (132) on the wafer (130). The location of the ball shaped ends (118) of the test probes is controlled by the location of the opening in the cantilevered sections (118) of the thin polymer sheet (120).

Figure 17:
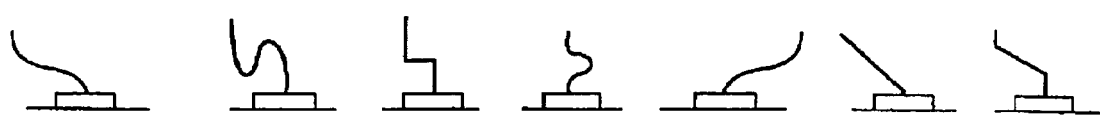
FIG. 17 shows various shapes to the elongated conductors such as "S" shaped, curved, piece wire linear or combination thereof.

FIG. 17 schematically shares a variety of shape of probe wires useful to practice the present invention, such as "S" showed "C" shaped, continuously curved, piece wire curved, piece wire linear and combinations thereof.

Figure 18:
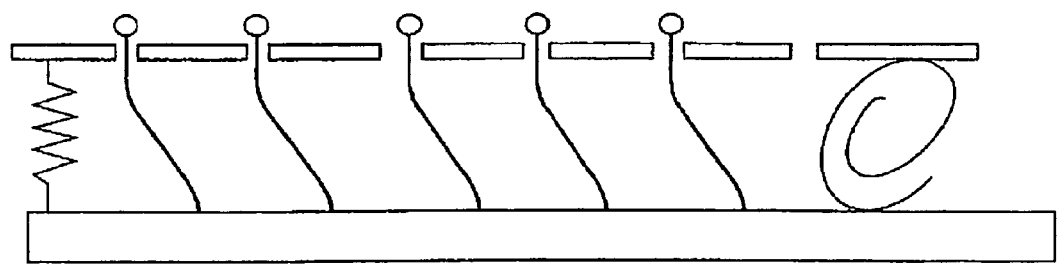
FIG. 18 shows spring means for maintaining sheet (20) resiliently spaced apart from surface (12) of substrate (11). The resilient spacers can be springs or are elastomeric material.

FIG. 18 schematically shows alternative embodiments of compliant frame structures (17) to support probe tip positioning structure (20) to be maintaining in position and to move as the probe tip ends (16) move when they are moved into engagement with electronic device pads (31).

Figure 19:
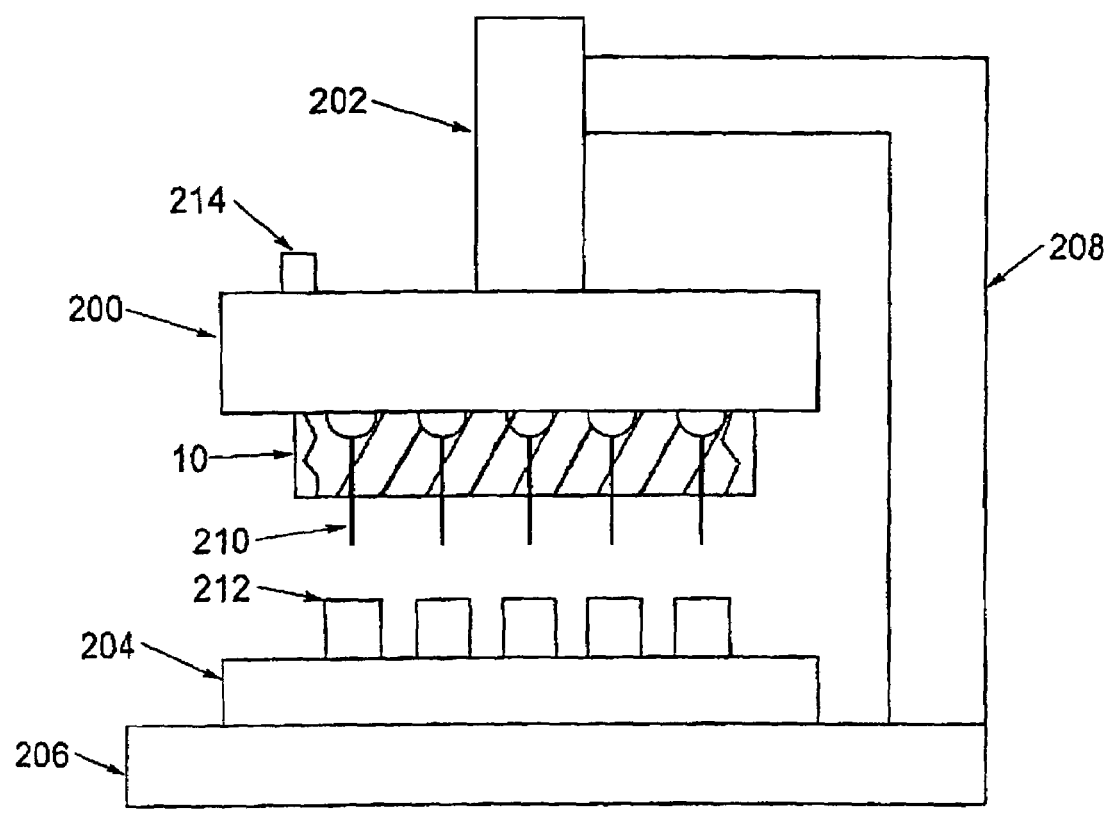
FIG. 19 shows a schematic diagram of a probing apparatus incorporating the probe structures of the present invention.

FIG. 19 schematically shows an apparatus for moving probe structure 10 towards and away from electronic device 204 so that probe tips 210 engage and disengage electrical contact locations 212 on electronic device 204. Probe 10 is mounted on to holder 200 having means 214 for applying electric power to the probe tips 210. Electronic device 206 is held on base 206. Holder 200 is physically connected to support 202 which is converted to arm 208 which is converted to base 206. Support 202 is adapted for up and down movement. Examples of an apparatus to provide the means for support and up and down movement can be found in U.S. Pat. No. 5,439,161 and U.S. Pat. No. 5,132,613, the teachings of which are incorporated herein by reference.

The teaching of the following patent co-pending applications are incorporated herein by reference:

U.S. Pat. No. 5,371,654 entitled, "THREE DIMENSIONAL HIGH PERFORMANCE INTERCONNECTION PACKAGE";

U.S. patent application Ser. No. 08/614,417 entitled, "HIGH DENSITY CANTILEVERED PROBE FOR ELECTRONIC DEVICES", now U.S. Pat. No. 5,811,982;

U.S. patent application Ser. No. 08/641,667 entitled, "HIGH DENSITY TEST PROBE WITH RIGID SURFACE STRUCTURE" U.S. Pat. No. 5,785,538;

U.S. patent application Ser. No. 08/527,733 entitled, "INTERCONNECTOR WITH CONTACT PADS HAVING ENHANCED DURABILITY" U.S. Pat. No. 5,810,607;

U.S. patent application Ser. No. 08/752,469 entitled, "FOAMED ELASTOMERS FOR WAFER PROBING APPLICATIONS AND INTERPOSER CONNECTORS";

U.S. patent application Ser. No. 08/744,903 entitled, "INTEGRAL RIGID CHIP TEST PROBE" U.S. Pat. No. 5,838,160;

U.S. patent application Ser. No. 08/756,831 entitled, "HIGH TEMPERATURE CHIP TEST PROBE" (abandoned);

U.S. patent application Ser. No. 08/756,830 entitled, "A HIGH DENSITY INTEGRAL TEST PROBE AND FABRICATION METHOD" abandoned;

U.S. patent application Ser. No. 08/754,869 entitled, "HIGH DENSITY INTEGRATED CIRCUIT APPARATUS, TEST PROBE AND METHODS OF USE THEREOF" U.S. Pat. No. 5,821,763.

It is to be understood that the above described embodiments are simply illustrative of the principles of the invention. Various other modifications and changes may be devices by those of skill in the art which will embody the principles of the invention and fall within the spirit and scope thereof.

What is claimed is:

1. A structure comprising:
a substrate having a surface;
a plurality of bond wire elongated electrical conductors extending away from said surface;
each of said bond wire elongated electrical conductors having a first end affixed to said surface at an electrical contact location and a second end projecting away from said surface;
there being a plurality of said second ends;
said first end and said second end of said bond wire elongated electrical connector having a ball-shaped protuberance positioned thereon;
means for permitting each of said plurality of said second ends to move about reference positions;
wherein said means for permitting each of said plurality of second ends to move about reference positions is a sheet of material having a plurality of through-holes therein through which said second ends project, there being a perforation in each said sheet in the vicinity of said openings.

2. The structure according to claim 1 wherein said perforation comprises a plurality of independent perforations about each of said through hole.

3. The structure according to claim 1 wherein said perforation comprises a plurality of independent perforations about at least a part of said plurality of through-holes.

4. The structure according to claim 3 wherein the action of mating said plurality of said second end ball-shaped protuberances to a plurality of flat or recessed contacts on an IC device causes said plurality of second end ball shape protuberances to wipe against said IC contacts.

5. The structure according to claim 1 wherein said perforation is a portion coupled to an adjacent through-hole.

6. The structure according to claim 1 wherein said perforation is adjacent to a plurality of said through-holes.

7. The structure according to claim 1 wherein a plurality of said perforations form cantilevered flaps about more than one of said through-holes.

8. The structure according to claim 7, wherein said means for permitting each of said plurality of second ends to move about reference positions is a sheet of polymer material with a plurality of cantilever flaps and openings corresponding to said plurality of said second end ball-shaped protuberances.

9. The structure according to claim 8, further including an epoxy material used to bond the plurality of ball shaped protuberances to the corresponding openings in said cantilever flaps.

10. The structure according to claim 7, wherein said means for permitting each of said plurality of second ends to move about reference positions is a sheet of polymer material with a plurality of openings corresponding to a plurality of cylindrical collars concentrically located on a plurality of probe wires.

11. The structure according to claim 1 wherein at said second end there is disposed a structure selected from the group consisting of a protuberance and a sharp.

12. A structure according to claim 11 wherein said protuberance is spherelike.

13. The structure according to claim 1 wherein at said second end there is disposed a structure selected from the group consisting of a protuberance and a sharp.

14. The structure according to claim 1 wherein said sheet comprises a sheet of electrically conductive material having a plurality of through holes therein, said sheet of material contains a dielectric material to provide a means for preventing said elongated electrical conductors from electrically contacting said sheet of electrically conductive material.

15. The structure according to claim 14 wherein said sheet has a top surface and a bottom surface and said through holes have a sidewall, said dielectric material coats said top surface and said bottom surface and said sidewall.

16. The structure according to claim 1 wherein said sheet is spaced apart from said surface by a flexible support.

17. The structure according to claim 16 wherein said flexible support is selected from the group consisting of a spring and an elastomeric material.

18. The structure according to claim 16 wherein said sheet and said flexible support form a space containing said plurality of elongated electrical conductors.

19. The structure according to claim 18 wherein said space is filled with a flexible material.

20. The structure according to claim 19 wherein said flexible material is an elastomeric material.

21. The structure according to claim 1 wherein said elongated electrical conductors have a shape selected from the group consisting of linear piece-wise linear, curved and combinations thereof.

22. A structure according to claim 1 wherein said plurality of elongated electrical conductors are distributed into a plurality of groups.

23. The structure according to claim 22 wherein said plurality of groups are arranged in an array.

24. The structure according to claim 23 wherein each of said groups corresponds to an integrated circuit chip on a substrate containing a plurality of said integrated circuit chips.

25. The structure according to claim 24 wherein said substrate containing said plurality of integrated circuit chips is a wafer of said integrated circuit chips.

26. The structure according to claim 1 wherein said structure is a probe for an electronic device.

27. The structure according to claim 26 wherein said electronic device is selected from the group consisting of an integrated circuit and a packaging substrate.

28. An apparatus for suing said structure of claim 1 to test an electronic device comprising:
means for holding said structure of claim 1; means for retractable moving said structure of claim 1 towards and away from said electronic device so that said second ends contact electrical contact locations on said electronic device, and means for applying electrical signals to said elongated electrical conductors.

29. The structure according to claim 1 wherein said sheet comprises a sheet of electrically conductive material having a plurality of through holes therein, and a sheet of dielectric material having a plurality of second through holes therein, said first through holes are aligned with said second through holes, said first through holes have a smaller diameter than said second through holes to provide a means for preventing said elongated electical conductors from electrically contacting said sheet of electrically conductive material.

30. The structure according to claim 29 wherein said sheet of electrically conductive material has a first side and a second side, said sheet of dielectric material is disposed on either of said first side and said second side of said sheet of electrically conductive material.

31. The structure according to claim 30 where there is disposed on said first side and said second side of said sheet of electrically conductive material, a layer of said dielectric material.

32. The structure according to claim 1 wherein said sheet comprises a sheet of rigid material having a plurality of through holes therein, said sheet contains a dielectric material to provide a means for preventing said elongated electrical conductors from electrically contacting said sheet of electrically conductive material.

33. The structure according to claim 32 wherein said sheet is spaced apart from said surface by a flexible support, said sheet of rigid material is disposed on said flexible support.

34. The structure according to claim 1 wherein said sheet is formed from a material selected from the group consisting of Invar, Cu/Invar/Cu, molybdenum, polyimides.

35. The structure according to claim 1 wherein said sheet is formed from a material selected from the group consisting of metal, a polymer, semiconductor and dielectric.

36. The structure according to claim 1, further including a layer of elastomer material surrounding said ball shaped protuberances positioned at said first end of said bond wire elongated electrical conductors and a substantial portion of said bond wire elongated electrical conductors.

37. The structure according to claim 1, further including a plurality of cylindrical collars concentrically located on the plurality of probe wires and positioned between the top surface of said elastomer material and said second end ball shape protuberances on the end of said probe wires.

38. The structure according to claim 1, further including a plurality of probe arrays corresponding to the location of a plurality of IC devices on a wafer.

39. A method comprising:
providing a substrate having a surface;
forming a plurality of bond wire elongated electrical conductors extending away from said surface;
each of said bond wire elongated electrical conductors having a first end affixed to said surface at an electrical contact location and a second end projecting away from said surface;
there being a plurality of said second ends;
said first end and said second end of said bond wire elongated electrical connector having a ball-shaped protuberance positioned thereon;
providing means for permitting each of said plurality of said second ends to move about reference positions;
wherein said means for permitting each of said plurality of second ends to move about reference positions is a sheet of material having a plurality of through-holes therein through which said second ends project, there being a perforation in each said sheet in the vicinity of said openings.

* * * * *